United States Patent
Riviere et al.

(10) Patent No.: US 9,101,077 B2
(45) Date of Patent: Aug. 4, 2015

(54) ELECTRONIC COMPONENT PACKAGE WITH A HEAT CONDUCTOR

(71) Applicant: STMicroelectronics (Grenoble 2) SAS, Grenoble (FR)

(72) Inventors: Jean-Michel Riviere, Froges (FR); Karine Saxod, Les Marches (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 242 days.

(21) Appl. No.: 13/722,282

(22) Filed: Dec. 20, 2012

(65) Prior Publication Data

US 2013/0155620 A1     Jun. 20, 2013

(51) Int. Cl.
*H05K 7/20* (2006.01)
*H01L 23/34* (2006.01)
*G01F 1/20* (2006.01)
*G06F 1/20* (2006.01)

(52) U.S. Cl.
CPC .. *H05K 7/20* (2013.01); *G01F 1/20* (2013.01); *H01L 23/34* (2013.01)

(58) Field of Classification Search
CPC ......... H01L 23/31; H01L 23/10; H01L 23/28; H01L 23/34; H01L 23/473; H01L 23/48; H05K 7/20; G06F 1/20
USPC ............... 361/679.46, 679.54, 704–712, 715, 361/719–724, 760–764; 165/80.2, 80.3, 165/104.33, 185; 257/706–727, 796, 675, 257/676; 438/106, 108, 122; 174/15.1, 174/16.3, 252; 29/832
See application file for complete search history.

(56) References Cited

U.S. PATENT DOCUMENTS

| | | | | |
|---|---|---|---|---|
| 5,710,459 A * | 1/1998 | Teng et al. | ..... | 257/717 |
| 5,889,323 A * | 3/1999 | Tachibana | ..... | 257/704 |
| 5,933,324 A * | 8/1999 | Barrett | ..... | 361/703 |
| 5,977,626 A * | 11/1999 | Wang et al. | ..... | 257/707 |
| 6,008,536 A * | 12/1999 | Mertol | ..... | 257/704 |
| 6,057,600 A * | 5/2000 | Kitazawa et al. | ..... | 257/728 |
| 6,278,613 B1 * | 8/2001 | Fernandez et al. | ..... | 361/719 |
| 6,392,888 B1 * | 5/2002 | Chen et al. | ..... | 361/704 |
| 6,528,876 B2 * | 3/2003 | Huang | ..... | 257/706 |
| 6,567,270 B2 * | 5/2003 | Shieh et al. | ..... | 361/719 |
| 6,599,779 B2 * | 7/2003 | Shim et al. | ..... | 438/122 |
| 6,720,649 B2 * | 4/2004 | Huang | ..... | 257/706 |
| 6,822,867 B2 * | 11/2004 | Hsieh | ..... | 361/704 |
| 6,903,271 B2 * | 6/2005 | Pearson et al. | ..... | 174/548 |
| 6,933,602 B1 * | 8/2005 | Patel et al. | ..... | 257/712 |
| 6,943,436 B2 * | 9/2005 | Radu et al. | ..... | 257/678 |
| 6,972,216 B2 * | 12/2005 | Huang et al. | ..... | 438/122 |
| 7,122,911 B2 * | 10/2006 | Yang | ..... | 257/796 |
| 7,342,304 B2 * | 3/2008 | Huang | ..... | 257/706 |
| 7,446,408 B2 * | 11/2008 | Shim et al. | ..... | 257/706 |
| 7,781,882 B2 * | 8/2010 | Zhong et al. | ..... | 257/707 |
| 8,022,512 B2 * | 9/2011 | Ramos et al. | ..... | 257/666 |

(Continued)

OTHER PUBLICATIONS

Extended European Search Report received in Application No. 11306705.2—1235, Applicant: STMicroelectronics (Grenoble 2) SAS, mailed Jun. 5, 2012, 7 pages.

*Primary Examiner* — Michail V Datskovskiy
(74) *Attorney, Agent, or Firm* — Slater & Matsil, L.L.P.

(57) ABSTRACT

An electronic component package includes a support and heat conductor. The heat conductor has a protuberance and the support has a socket arranged to be able to receive the protuberance so that the movement of heat conductor relative to the support during the assembly process is reduced.

20 Claims, 3 Drawing Sheets

(56) References Cited

U.S. PATENT DOCUMENTS

| | | |
|---|---|---|
| 2002/0079593 A1 | 6/2002 | Huang |
| 2003/0035270 A1* | 2/2003 | Shieh et al. .................. 361/718 |
| 2003/0057545 A1 | 3/2003 | Shim et al. |
| 2006/0219385 A1* | 10/2006 | Bell et al. ..................... 165/80.2 |
| 2007/0200207 A1* | 8/2007 | Ramos et al. ................. 257/666 |
| 2009/0283902 A1* | 11/2009 | Bezama et al. ............... 257/713 |
| 2011/0079902 A1* | 4/2011 | Sakamoto et al. ............ 257/738 |

* cited by examiner

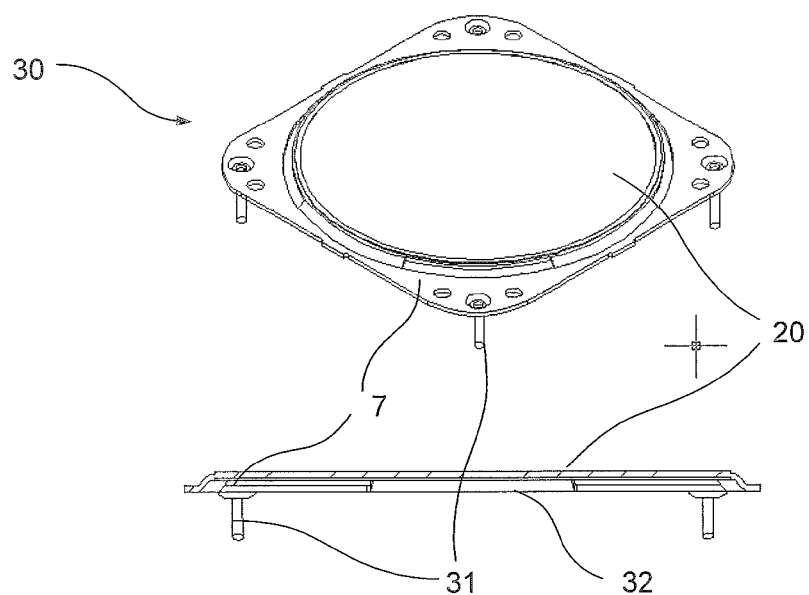
Fig 3
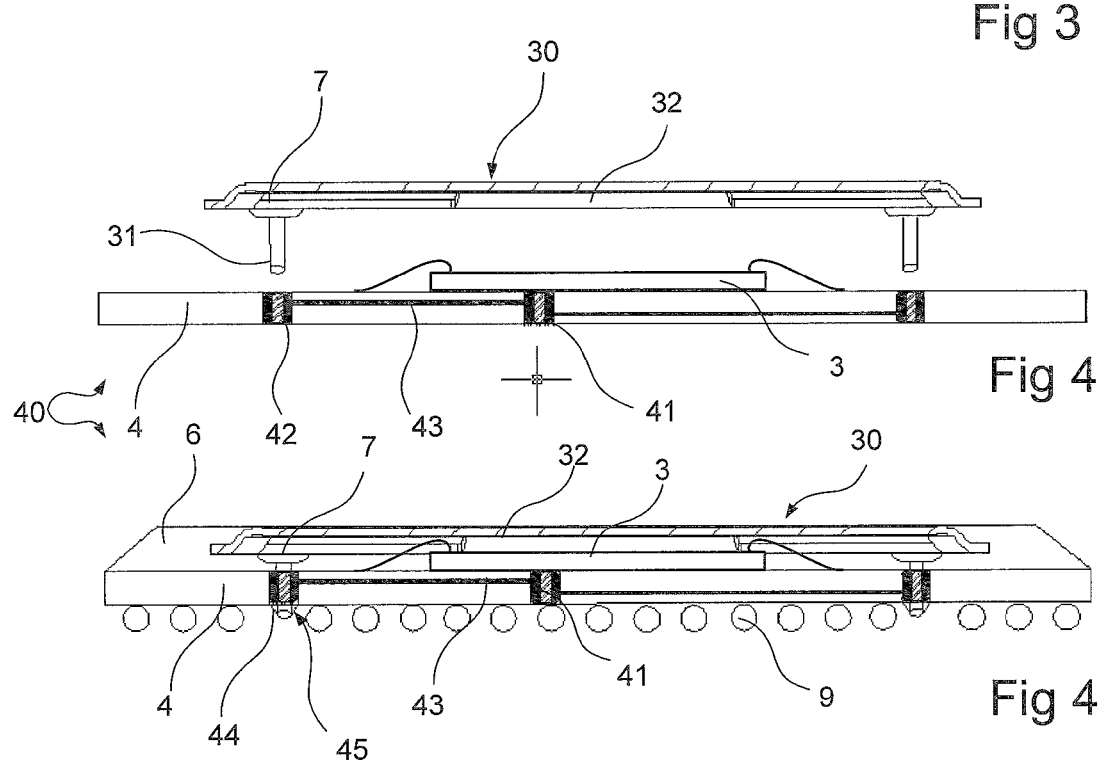
Fig 4a
Fig 4b

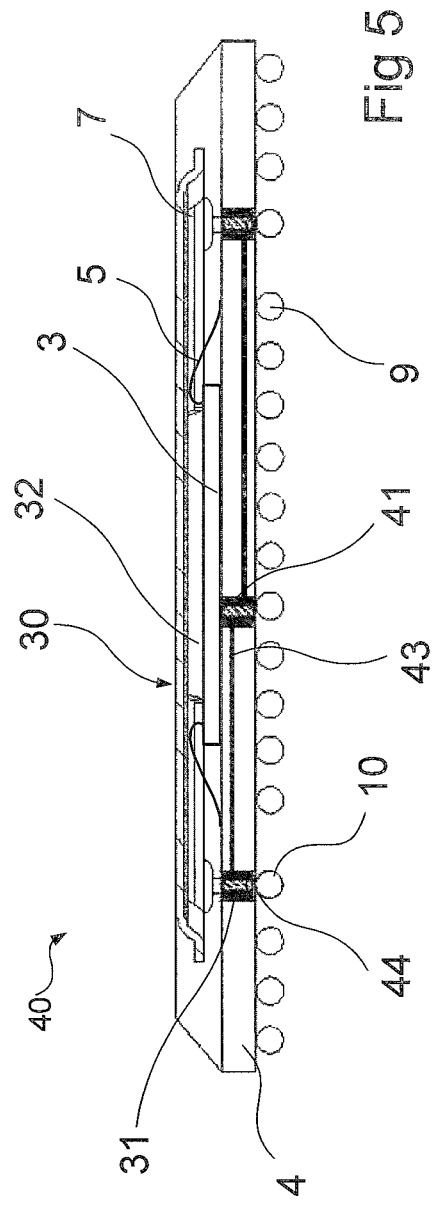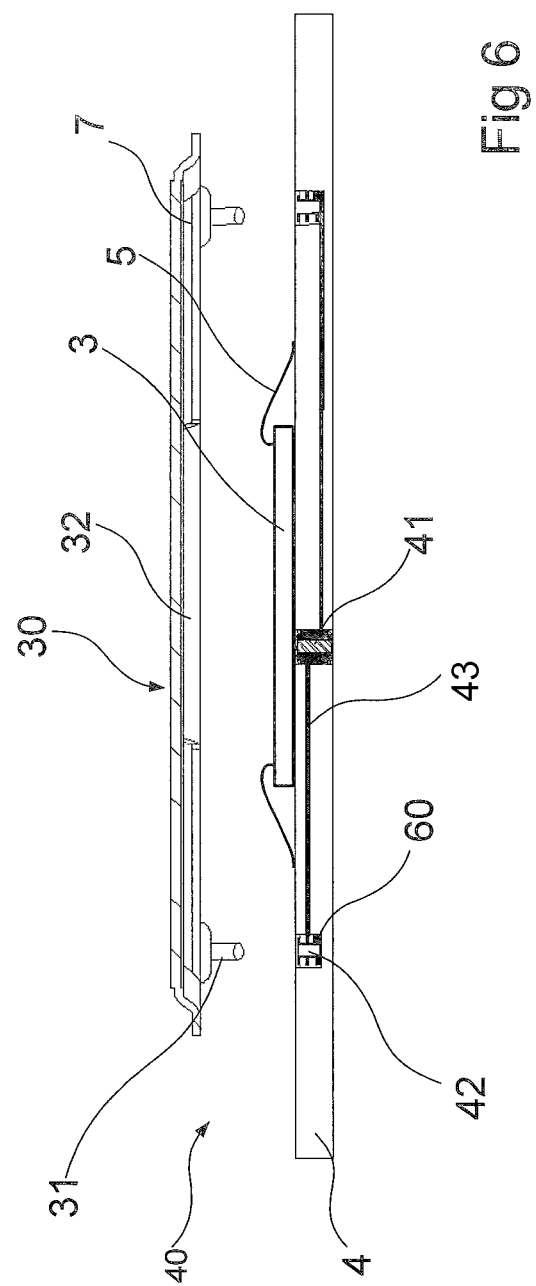

US 9,101,077 B2

ELECTRONIC COMPONENT PACKAGE WITH A HEAT CONDUCTOR

This application claims priority to European Patent Application 11306705.2, which was filed Dec. 20, 2011 and is incorporated herein by reference.

TECHNICAL FIELD

The present disclosure relates to packages for electronic components and, in particular embodiments to integrated circuits where dissipating heat is advantageous.

BACKGROUND

Electronic components, such as integrated circuits, are often packaged by mounting them on a support, or substrate as it is sometimes known, and then encapsulating them in a block of resin.

The resin protects the component but is a thermal insulator. However, the integrated circuit (IC), or other electronic component, produces heat that must be removed from the package. In certain cases, for example, with complex system-on-chip IC's, the amount of heat produced is such that conduction through the resin and substrate are not enough.

SUMMARY OF THE INVENTION

Therefore it is desirable to provide a heat conductor for an electronic component package which addresses these concerns.

One embodiment provides a heat conductor that comprises a support. The support has at least one socket. The heat conductor has at least one protuberance arranged to fit into the at least one socket. This arrangement provides improved conduction of heat away from the IC and permits accurate placement of the heat conductor relative to the IC. Since a heat conductor placed above the IC risks being moved during the assemble process, this arrangement has an advantage in that it holds the heat conductor in position during subsequent steps in the assembly process.

According to an embodiment, the heat conductor has at least three protuberances.

According to an embodiment, at least one of the protuberances is at least as long as the thickness of the support, and extends beyond an exit point of the socket.

There is also provided a support for an electronic component package which comprises a heat conductor. The heat conductor has at least one protuberance. The support has at least one socket arranged to receive the at least one protuberance. In cooperation with the heat conductor provided herewith, the heat conductor is better held in place during the assembly process.

According to an embodiment, the support has at least three sockets.

According to an embodiment, the support has at least one of the at least one sockets traversing the full thickness of the support.

According to an embodiment, the support has at least one of the at least one sockets terminating inside the support.

There is also provided an electronic component package comprising a support and a heat conductor. The heat conductor has a protuberance and the support has a socket arranged to be able to receive the protuberance.

According to an embodiment, in the electronic component package, the socket has an exit point and there is conductive sticking material deposited on the exit point.

According to an embodiment, in the electronic component package, the socket has an exit point and there is a solder ball attached to the exit point.

Another embodiment provides a method where a heat conductor has a protuberance. At least one support has an electronic component attached and has at least one socket arranged to receive the protuberance. The heat conductor is positioned so that the at least one protuberance is inserted into the at least one socket. A conductive sticking material is applied so as to form a joint between the at least one protuberance and the at least one socket.

According to an embodiment, in the method, conductive sticking material is applied after the positioning of the heat conductor.

According to an embodiment, in the method, conductive sticking material is applied before the positioning of the heat conductor.

According to an embodiment, the heat conductor has a central region arranged to come into contact with an electronic component when the heat conductor is in position above the electronic component.

BRIEF DESCRIPTION OF THE DRAWINGS

The foregoing and other purposes, features, aspects and advantages of the embodiments described herein will become apparent from the following detailed description, given by way of illustration and not limitation with reference to the accompanying drawings, in which:

FIG. 3 illustrates a heat conductor according to an embodiment;

FIG. 4a illustrates an electronic component package according to an embodiment in an exploded view;

FIG. 4b illustrates the electronic component package of FIG. 4a assembled;

FIG. 5 illustrates an electronic component package according to another embodiment; and FIG. 6 illustrates an electronic component package according to another embodiment.

DETAILED DESCRIPTION OF ILLUSTRATIVE EMBODIMENTS

In the interests of clarity same references indicate same elements and features which have been discussed once will not be described further. The following description makes reference to integrated semiconductor circuits (ICs) but it will be appreciated that any electronic component could be substituted.

Figure 1:
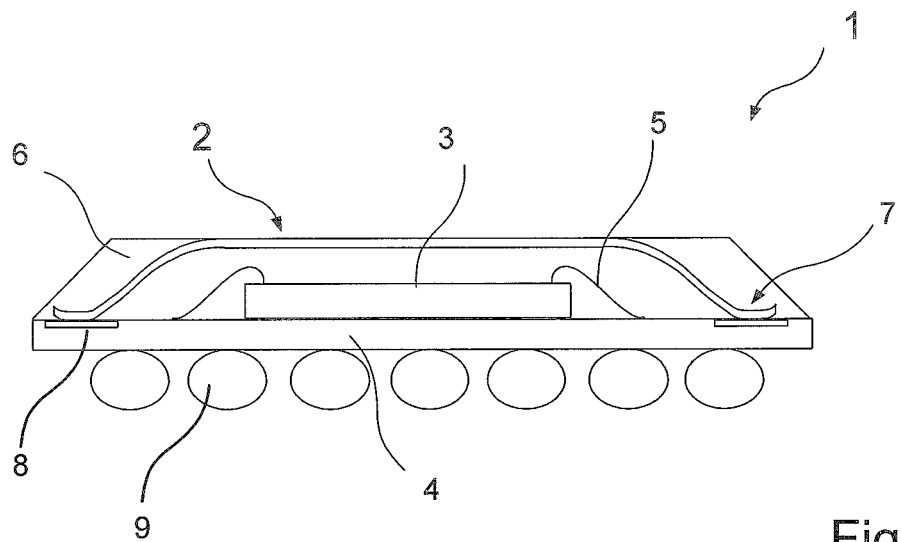
FIG. 1 illustrates an electronic component package with a heat conductor.

FIG. 1 illustrates an electronic component package 1 with a possible implementation of a heat conductor 2, which acts as a heat-spreader. An IC 3 is attached to a substrate 4. In this case, the IC 3 is shown as being electrically connected to the substrate by wire-bonds 5 but other connection means could equally be employed. The IC 3 and the heat conductor 2 are enclosed in a block of resin 6. The heat conductor 2 is positioned over the IC 3 and is shaped so that it curves down around the IC 3 to flattened regions 7 where it is attached to the substrate 4 at attachment points 8. In this example, the substrate 4 has solder balls 9 on its other surface. The attachment points 8 may be solder pads and the means of attachment may be some sticking material. It is advantageous to provide thermally conductive connections (not shown) from the attachment point 8, via the substrate 4, to the solder balls 9.

Possible choices for the conductive sticking material can be conductive glue, like silver-loaded epoxy, or solder paste.

Figure 2:
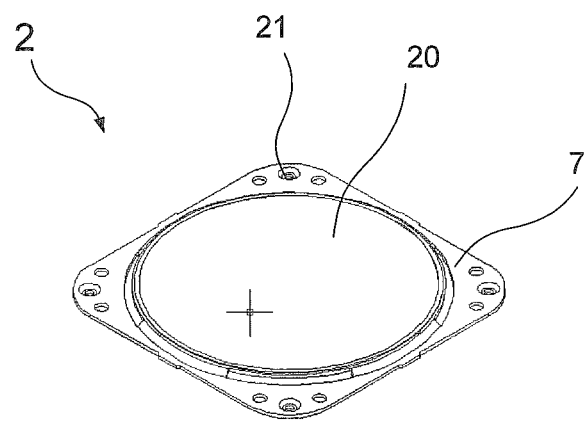
FIG. 2 illustrates a heat conductor.

FIG. 2 illustrates a three dimensional view of a heat conductor 2 like that described above. It has a flat plate area 20 which is positioned above the IC 3 in the final package. It is often the case that the flat plate area 20 is left free of resin in the finished package. This is achieved by making it of the same height as the upper surface of the cavity of the molding press used to form the block of resin 6. The flattened regions 7 may have holes 21 which are intended to improve the robustness of the soldering.

The manufacturing of such a package involves a step where the conductive sticking material is deposited on the attachment points 8 and then the heat conductor 2 is placed so that the flattened regions 7 contact the conductive sticking material. Then the unit, usually held on a tray with other units, is transported to a furnace in order to solidify the sticking material and complete the attachment. It happens that the heat conductor 2 may move during the transportation. It may become tilted or move laterally, in translation and rotation, relative to the substrate 4 or some combination thereof.

Lateral movement of the heat conductor 2 causes the area of contact between the flattened regions 7 and attachment points 8 of the substrate 4 to be reduced. This is undesirable in that, even if it does not prevent completely the formation of the joints, it risks weakening them. Furthermore, in some cases there may be multiple components under the heat conductor, making the positioning even more critical. A typical specification for the lateral positioning relative to the substrate which is currently achievable is ±300 micrometers. This can be compared to that of the lateral positioning of the die which is ±50 micrometers.

Thus there is a risk that the heat conductor, which is often made of metal, causing short circuits. It is desirable to tighten the specification for the lateral positioning of the heat conductor 2 to achieve tolerances closer to those of the die placement.

Tilting of the heat conductor 2 is undesirable in that one or more of flattened regions 7 will be further from their corresponding attachment points 8 than would otherwise be the case. This can mean that the joints at those places are weaker. Indeed, cracks in these joints may eventually form, especially as pressure is applied to the heat conductor 2 during placement and molding. Furthermore, because the flat plate area 20 is not parallel to the substrate 4, and hence the mold cavity, resin may cover part of the flat plate area 20. This means that marking the unit correctly is more difficult and the resulting unit is not visually acceptable.

FIG. 3 illustrates a heat conductor 30 according to an embodiment. The heat conductor 30 has a flat plate area 20 and flattened regions 7. In the flattened regions 7, in place of the holes 21, it has protuberances 31 projecting down, in the opposite direction to the upper surface of the flat plate area 20. These protuberances 31 may conveniently take the form of pins or columns. The heat conductor 30 may also have a central region 32, which is thickened so that when the heat conductor 30 is in position, the central region 32 comes into contact with the upper surface of the IC 3.

FIGS. 4a and 4b illustrate, respectively, exploded and assembled views of an electronic component package 40 comprising a heat conductor 30 like that of FIG. 3. The support 4, for example a substrate, has conductive columns 41. The conductive columns 41 may be metallized holes, often known as 'vias'. The attachment points 8 of FIG. 1 are now replaced by sockets 42 in the form of metallized holes which pass completely through the support 4. The conductive columns 41 and the sockets 42 may be conveniently linked by metal tracks 43. The protuberances 31 and the sockets 42 are arranged to be aligned and so that the protuberances 31 fit into the sockets 42. The alignment is chosen so that the heat conductor 30 is in the desired position relative to the substrate 4 and IC 3. The protuberances 31 may be arranged to project beyond the support 4.

A conductive sticking material 44 may be employed on the exit points 45 of the sockets 42 to form connections between the protuberances 31 and the sockets 42. The conductive sticking material may penetrate partially into the sockets 42. This has the benefit of protecting the exit points 45 of the sockets. The conductive sticking material may also be applied before the heat conductor 30 is put into position. The conductive sticking material 44 and the metal tracks may help improve the thermal conduction between the heat conductor 30 and the outside of the package.

Also conductive sticking material 44 may also be applied to the top surface of sockets 42 where the protuberances 31 enter. This conductive sticking material 44 may be, for convenience, the same as that employed for the exit points 45. The skilled person will be able to choose a material of sufficiently low viscosity to avoid impeding the insertion of the protuberances 31.

The arrangement of the protuberances 31 and the sockets 42 serves to reduce the risk of lateral movement between the heat conductor 30 and the support 4. Because the protuberances 31 project into the sockets 42, the risk of tilting is also reduced. One of ordinary skill will be able to calculate the tolerances between protuberances 31 and sockets 42 to achieve an optimum compromise between ease of insertion and reduction of lateral movement and tilting. The arrangement of the protuberances 31 and the sockets 42 serves to reduce the warpage of the support 4. The positions and numbers of protuberances and sockets are chosen to minimize warpage of support 4.

FIG. 5 illustrates, in an assembled view, another embodiment wherein solder balls 10 are soldered directly to the exit points 45 of the sockets 42. This also has the effect of joining the protuberances 31 to the sockets 42. Some penetration of solder into the sockets 42 may occur which can alter the height of the solder ball 10 if it is not accounted for. In this case, it may be more convenient if the protuberances 31 do not project beyond the exit points 45 of the sockets 42.

FIG. 6 illustrates, in an exploded view, another embodiment wherein the sockets 42 do not pass through the support 4 but stop at a layer 60 inside the support 4. Using an internal metal layer for layer 60 is convenient. Such sockets 42 are referred to as 'blind'. Where this embodiment is used, conductive sticking material is applied onto the sockets 60 from the upper surface, much like the process described in relation to FIG. 1. This embodiment has an advantage in that dispensing the glue or paste is easier than is the case with the embodiment of FIG. 4. This embodiment also avoids the need for extra care for the placement of the solder balls 10 described in relation to the embodiment of FIG. 5. Also the blind sockets 60 leave the under-surface of the support 4 free for other connections. Because the protuberances 31 are shorter, this embodiment may give less control over the tilting.

Having thus described at least one illustrative embodiment of the invention, various alterations, modifications and improvements will readily occur to those skilled in the art. These alterations, modifications and improvements can used with any of the embodiments discussed herein and features of one of the embodiments can be combined or used with other ones of the embodiments.

For example, the three-dimensional figures show the heat conductor having four attachment areas and hence four protuberances 31. Two attachment points are sufficient to prevent lateral translational and rotational motion. However three or more protuberances 31 give more control over tilting, for given tolerances of protuberance 31 and hole 42. Where the heat conductor is large, it may be more convenient to use at least four protuberance 31-socket 42 pairs. The compromise between the choice of the number of protuberances 31-socket 42 pairs and their dimensional tolerances is within the reach of one of ordinary skill.

It may be found that an acceptable compromise between process complexity and control over the displacement of the heat conductor may be achieved by mixing the blind sockets 42 of FIG. 6 and the sockets 42 that pass completely through as in FIGS. 4a-4b or FIG. 5.

It may be possible to leave some of the sockets 42 without conductive sticking material 44 whilst still achieving acceptable position control and reduce support warpage.

It may be found that extra protuberances 31 beyond the four shown in FIG. 3 are useful.

A convenient materiel for the heat conductor 30 is copper coated with nickel. However other materials may be chosen as long as they are sufficiently heat-conducting and can be formed with the chosen tolerances.

It may also be useful to have additional regions of the heat conductor 30 which rest on the upper surface of the support 4 in a manner similar to that described in relation to FIG. 1.

The central region 32 of the heat conductor 30 may be absent or replaced by some other means of thermally connecting the heat conductor 30 and the IC 3. Such other means may consist of thermally conductive glue.

Accordingly, the foregoing description is by way of example only and is not intended to be limiting. The invention is limited only as defined in the following claims and the equivalent thereto.

What is claimed is:

1. An electronic component package comprising:
a support comprising metal tracks within the support;
a heat conductor; and
a conductive column disposed in the support and coupled to the metal tracks;
wherein
the heat conductor has a first protuberance and a second protuberance, and the support has a first socket and a second socket arranged to be able to receive the first protuberance and the second protuberance, respectively;
the first socket and the second socket each have an exit point and there is conductive sticking material attached to the exit point of each of the first socket and the second socket;
the first protuberance and the second protuberance each extends beyond the exit point of each of the first socket and the second socket; and
the metal tracks within the support couple the first socket with the second socket.

2. The heat conductor of claim 1, wherein the heat conductor includes at least three protuberances.

3. The heat conductor of claim 1, wherein at least one of the protuberances is longer than a thickness of the support.

4. The heat conductor of claim 1, further comprising a plurality of solder balls disposed at an underside of the support, each of the solder balls electrically coupled to the electronic component.

5. The electronic component package of claim 1, wherein the sticking material comprises a solder ball.

6. An electronic device, comprising:
a support, the support including a plurality of sockets;
an electronic component mounted on the support;
a heat conductor comprising a plurality of pins, each pin disposed within a respective one of the sockets, wherein each pin extends beyond an exit point of the respective socket; and
a conductive column disposed in the support, wherein the conductive column and the sockets are linked by metal tracks, and wherein a first socket is linked to the conductive column by a first metal track and wherein a second socket is linked to the conductive column by a second metal track, the first metal track spaced from an upper surface of the support by a first distance and the second metal track spaced from the upper surface of the support by a second distance that is different than the first distance.

7. The electronic device of claim 6, wherein the heat conductor touches an upper surface of the electronic component.

8. The electronic device of claim 7, further comprising an encapsulation material encapsulating the electronic component, an upper surface of the heat conductor exposed outside the encapsulation material.

9. The electronic device of claim 6, further comprising a further solder ball attached to one of the pins.

10. The electronic component package of claim 1, wherein the first socket is linked to the conductive column by a first metal track of the metal tracks and wherein the second socket is linked to the conductive column by a second metal track of the metal tracks, the first metal track spaced from an upper surface of the support by a first distance and the second metal track spaced from the upper surface of the support by a second distance that is different than the first distance.

11. The electronic component package of claim 1, wherein the heat conductor comprises copper coated with nickel.

12. The electronic device of claim 6, wherein the heat conductor comprises copper coated with nickel.

13. An electronic device, comprising:
a support comprising a plurality of metallized sockets passing through the support;
an integrated circuit die mounted on the support and electrically coupled to the support through a plurality of wire bonds;
a heat conductor comprising:
a central region, wherein the central region is substantially circular, has a first thickness, and the central region contacts the integrated circuit die,
a flattened region surrounding the central region and in contact with an upper surface of the support, wherein the flattened region has a second thickness that is thinner than the first thickness,
an intermediate region between the central region and the flattened region, the intermediate region including a curved portion, wherein the intermediate region connects the central region to the flattened region,
a plurality of pins directly connected to the flattened region, wherein each pin is disposed within a respective one of the plurality of metallized sockets and each pin extends beyond an exit point of the respective one of the plurality of metallized sockets. and
a conductive column disposed in the support and coupled to metal tracks.

14. The electronic device of claim 13, wherein a first socket of the plurality of metallized sockets is linked to the conductive column by a first metal track of the metal tracks and wherein a second socket of the plurality of metallized sockets is linked to the conductive column by a second metal track of the metal tracks, the first metal track spaced from the upper surface of the support by a first distance and the second metal track spaced from the upper surface of the support by a second distance that is different than the first distance.

15. The electronic device of claim 13, wherein the heat conductor comprises copper coated with nickel.

16. An electronic device, comprising:
   a support comprising a plurality of sockets extending from an upper surface of the support to a socket depth, but not passing through the support;
   an integrated circuit die mounted on the support;
   a heat conductor comprising:
      a central region,
      a flattened region surrounding the central region and in contact with the upper surface of the support, and
      a plurality of pins directly connected to the flattened region, wherein each pin is disposed within a respective one of the plurality of sockets and each pin extends into the support to substantially the socket depth; and
   a conductive column disposed in the support and coupled to metal tracks.

17. The electronic device of claim 16, wherein a first socket of the plurality of sockets is linked to the conductive column by a first metal track of the metal tracks and wherein a second socket of the plurality of sockets is linked to the conductive column by a second metal track of the metal tracks, the first metal track spaced from the upper surface of the support by a first distance and the second metal track spaced from the upper surface of the support by a second distance that is different than the first distance.

18. The electronic device of claim 16, wherein the heat conductor comprises copper coated with nickel.

19. The electronic device of claim 16, wherein the central region is substantially circular, has a first thickness, and the central region contacts the integrated circuit die.

20. The electronic device of claim 19, wherein the flattened region has a second thickness that is thinner than the first thickness.

* * * * *